United States Patent
Chacinski et al.

(10) Patent No.: US 9,178,501 B2
(45) Date of Patent: Nov. 3, 2015

(54) METHOD FOR IMPROVING SIGNAL QUALITY OF A DIGITAL SIGNAL BEING TRANSMITTED THROUGH A NON-LINEAR DEVICE AND APPARATUS USING THE SAME

(71) Applicant: Tyco Electronics Svenska Holdings AB, Jaerfaella (SE)

(72) Inventors: Marek Grzegorz Chacinski, Farsta (SE); Nicolae Pantazi Chitica, Kista (SE)

(73) Assignee: Tyco Electronics Svenska Holdings AB, Jarfalla (SE)

( * ) Notice: Subject to any disclaimer, the term of this patent is extended or adjusted under 35 U.S.C. 154(b) by 0 days.

(21) Appl. No.: 14/244,783

(22) Filed: Apr. 3, 2014

(65) Prior Publication Data

US 2014/0301742 A1    Oct. 9, 2014

(30) Foreign Application Priority Data

Apr. 3, 2013  (EP) ..................................... 13162171

(51) Int. Cl.
*H03K 5/01* (2006.01)
*H04B 10/50* (2013.01)
*H04B 10/58* (2013.01)

(52) U.S. Cl.
CPC ................ *H03K 5/01* (2013.01); *H04B 10/502* (2013.01); *H04B 10/58* (2013.01)

(58) Field of Classification Search
CPC ...... H04B 10/58; H04B 10/5057; H04B 1/62; H04B 10/502; H01S 5/0428; H03D 2200/0088; H03D 7/1408; H04L 25/0264; H04L 25/03885; H04L 27/368; H03K 5/01
USPC ..................... 398/82, 192–194; 375/295, 296
See application file for complete search history.

(56) References Cited

U.S. PATENT DOCUMENTS

| | | | |
|---|---|---|---|
| 6,373,346 B1 | 4/2002 | Kobayashi | |
| 6,750,717 B1 * | 6/2004 | Kobayashi et al. | ........... 330/279 |
| 7,051,127 B2 | 5/2006 | Molgaard et al. | |
| 7,369,591 B1 | 5/2008 | Ziazadeh | |
| 7,701,480 B2 | 4/2010 | Omori et al. | |
| 8,229,303 B1 * | 7/2012 | Lindsay | ........................ 398/193 |
| 2011/0280265 A1 * | 11/2011 | Desbiens et al. | ........... 372/38.02 |
| 2012/0045218 A1 | 2/2012 | Sugawara et al. | |

FOREIGN PATENT DOCUMENTS

DE            3307309 A1    9/1984

OTHER PUBLICATIONS

European Search Report, Application No. 13162171.6, dated Aug. 23, 2013, 4 pages.

* cited by examiner

*Primary Examiner* — Vineeta Panwalkar
(74) *Attorney, Agent, or Firm* — Barley Snyder (57) ABSTRACT

A digital signal processing method has steps of pre-emphasizing a digital signal, and then processing the pre-emphasized digital signal through a non-linear device. In the pre-emphasizing step, an undershoot is applied to a first level of the digital signal at a positive signal transition or an overshoot is applied to the digital signal at a negative first signal transition.

21 Claims, 11 Drawing Sheets

METHOD FOR IMPROVING SIGNAL QUALITY OF A DIGITAL SIGNAL BEING TRANSMITTED THROUGH A NON-LINEAR DEVICE AND APPARATUS USING THE SAME

CROSS-REFERENCE TO RELATED APPLICATION

This application claims the benefit of the filing date under 35 U.S.C. §119(a)-(d) to European Patent Application No. 13162171.6, filed Apr. 3, 2013.

FIELD OF THE INVENTION

The present invention is generally related to a method for improving quality of a signal, and more specifically to a method for improving the quality of a signal being transmitted at high speed through a non-linear electrical and/or optical device.

BACKGROUND

Signal integrity has become a major concern in communication systems using high data rates such as 25 Gbps or higher.

Signal degradation can be caused by transmitting a signal through a bandwidth-limited channel, where the transmission frequency is significantly greater than a cutoff frequency. Passing a signal through such a channel results in attenuation of components at higher frequencies, which affects the shape of a pulse arriving at a receiver. Not only is the shape of the pulse within its symbol period changed, but the pulse is also spread out over the subsequent symbol periods. Consequently, when a signal is transmitted through such a channel, the spread pulse of each individual symbol will interfere with following symbols.

The bandwidth limitation can be due to the physical properties of the active components or a medium. For example, at bit rates of 25 Gbps, a copper cable may have a cutoff frequency above which practically none of the transmitted signals will propagate. Therefore, in order to provide sufficient bandwidth for high speed data transmission applications of bit rates of 25 Gbps and above, optical links are often used. Transmission of data over an optical link however, involves conversion of electrical digital signals into optical signals.

A laser diode, such as a Vertical Cavity Surface Emitting Laser (VCSEL), is conventionally used for converting electrical signals into optical signals. However, the laser diode is a non-linear device, and therefore the laser diode affects the shape of its output pulse. Problematically, this pulse distortion can cause intersymbol interference.

Figure 1:
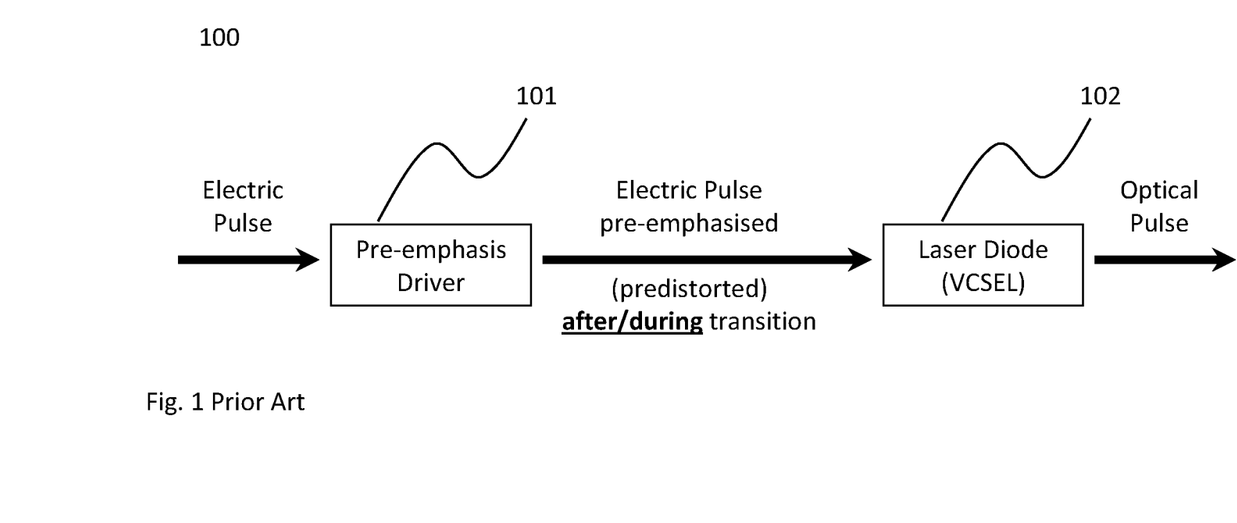
FIG. 1 shows a schematic of a conventional transmitter.

FIG. 1 shows a schematic of a conventional transmitter for converting an electrical digital signal into an optical signal and outputting the optical signal to an optical fiber. The conventional transmitter 100 comprises a pre-emphasis driver 101 (that pre-distorts the signal) and a laser diode 102 connected to the pre-emphasis driver 101. The pre-emphasis driver 101 receives at its input an electrical signal, pre-emphasizes the received signal, and outputs pre-distorted electrical pulses. The laser diode 102 receives at its input such electrical pulses from the pre-emphasis driver 101, converts the received electrical pulses into optical signals, and outputs the optical signals into the optical fiber (not shown in FIG. 1).

Figure 2A:
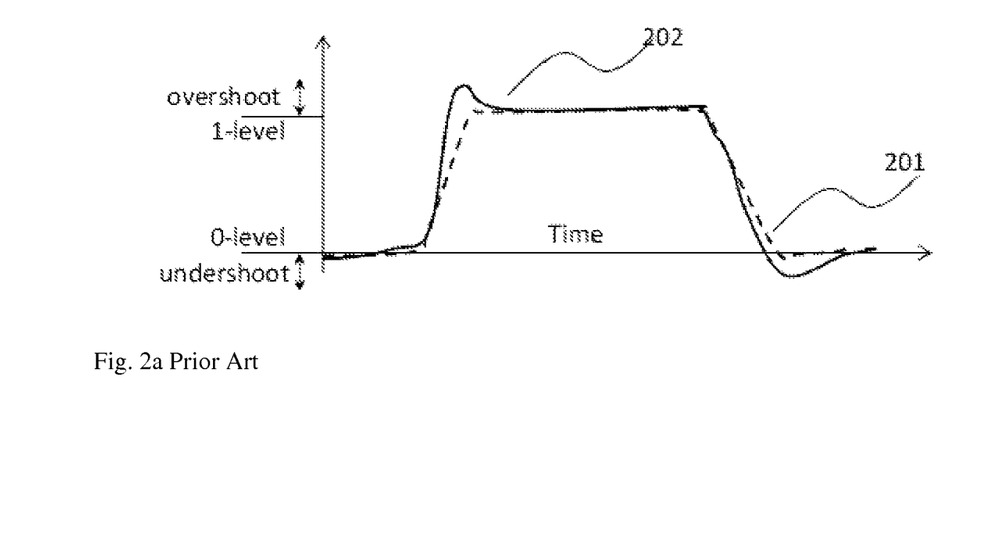
FIG. 2a shows the pulse shaping performed by a pre-emphasis driver of the conventional transmitter.

The pulse shaping performed by the pre-emphasis driver 101 is shown in FIG. 2. The curve 201 represents the shape of a pulse of a digital (binary) signal input to the pre-emphasis driver 101. This pulse makes a first, positive transition from a low level ("0"-level) to an high level ("1"-level), remains approximately constant at the high level during the pulse length, and thereafter makes a second, negative transition from the high level to the low level. For clarity, the "1"-level is defined as the high level, the "0"-level is defined as the low level, a positive transition is defined as a transition from the low level to the high level, and a negative transition is defined as a transition from the high level to the low level of the signal. The curve 202 represents the shape of the signal output by the pre-emphasis circuit 101 when the square pulse 201 is applied to its input. This curve exhibits an overshoot immediately after the positive transition from "0"-level to "1"-level and an undershoot immediately after the negative transition from "1"-level to "0"-level. Particularly, the curve 202 makes a transition from "0"-level to "1"-level, overshoots the "1"-level, relaxes to the "1"-level, makes a transition from "1"-level to "0"-level, undershoots the "0"-level, and then relaxes to the "0"-level.

Hence, the pre-emphasis driver 101 of the conventional transmitter 100 emphasizes/peaks an electrical digital signal during and/or immediately after the transition from one binary signal level to the other binary signal level.

Figure 2B:
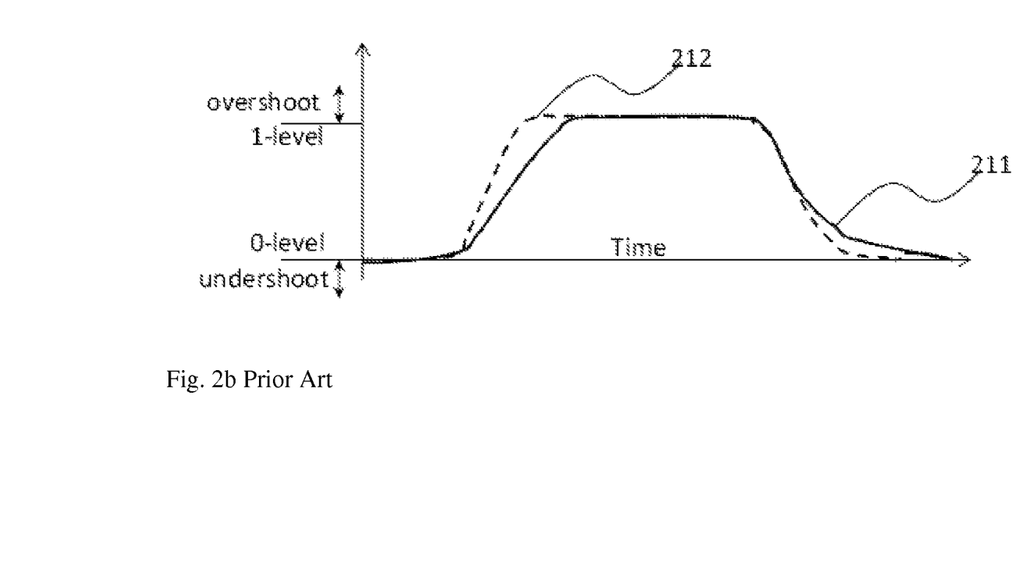
FIG. 2b shows pulses after filtering by a bandwidth-limited component.
Figure 2C:
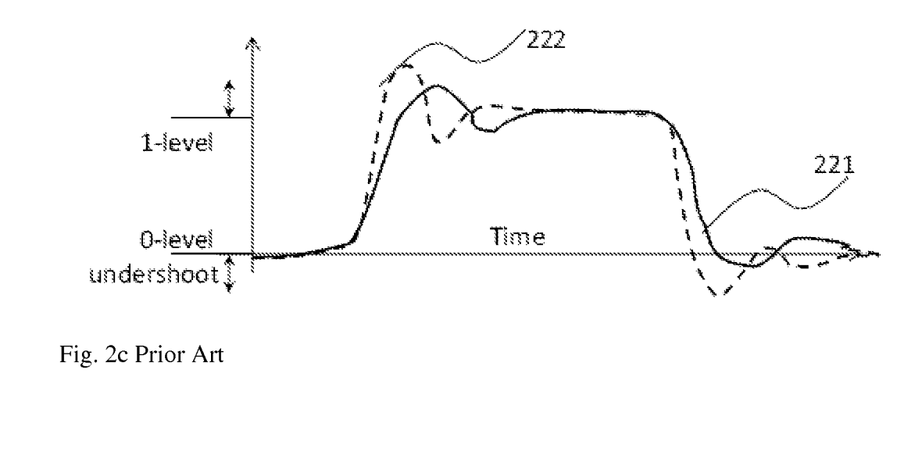
FIG. 2c shows pulses after propagation through a nonlinear component.

FIG. 2 also shows the shape of the signal output by a bandwidth limited component being excited with a signal without such a pre-distortion, and the shape of the signal output by the bandwidth limited component being excited with a signal having such a pre-distortion. Curve 212 exhibits more steep transitions between the low and high level compared to the curve 211. For the case of a non-linear device showing overshoot and ringing, when the pulse 201 and 202 are applied at its input, one will observe that the shape of the output signal looks like curve 221 and 222, respectively. Here, the pulse 222 exhibits shorter transition times (faster edges) compared to the pulse 221. In other words, pre-emphasis/peaking of the electrical pulse during and/or immediately after the transition from one binary signal level to the other binary signal level shortens the transition times at the edges of the pulse. The description of the behavior of the nonlinear component is detailed in FIG. 3.

Figure 3:
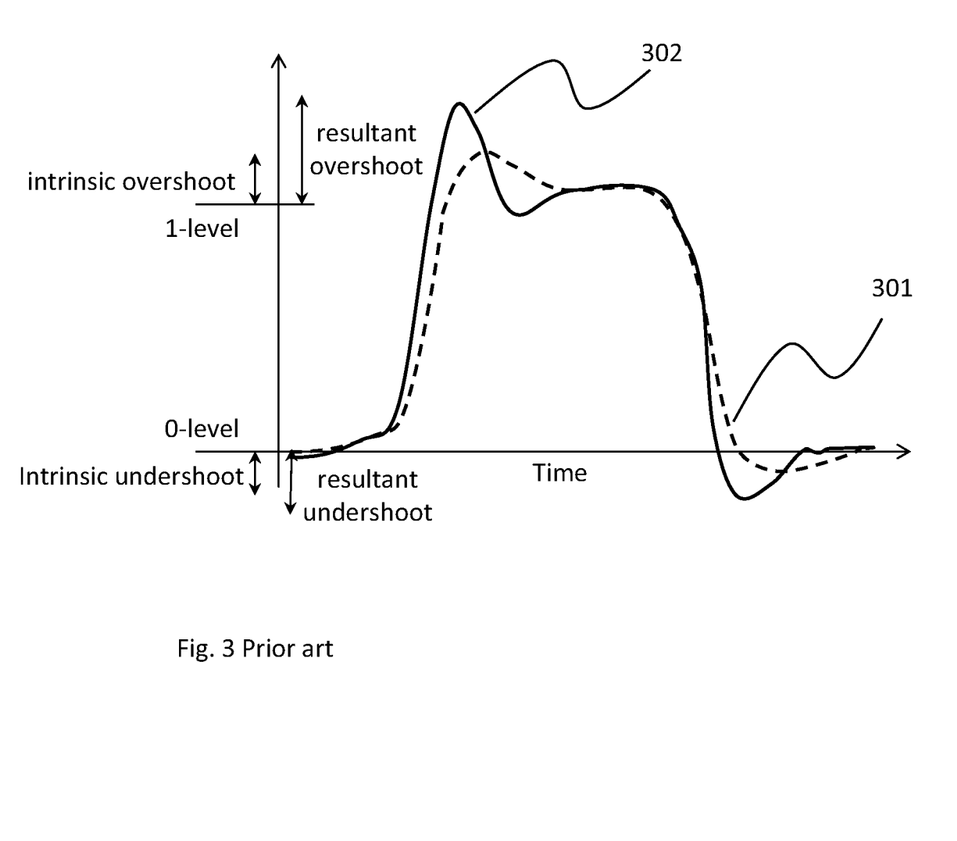
FIG. 3 shows the shape of optical pulses output by a laser diode of the conventional transmitter.

FIG. 3 shows optical signals (in terms of optical power) output by the laser diode 102 when driven by the pre-emphasis driver 101. The curve 302 represents the shape of an optical pulse output by the laser diode 102, when an electrical pulse corresponding to curve 202 in FIG. 2 showing pre-emphasis during/after the transition from one binary level to the other, applied at the input of the laser diode 102. The curve 301 represents the shape of an optical pulse output by the laser diode 102, when an electrical pulse corresponding to curve 201 of FIG. 2 showing an electrical pulse without pre-emphasis, is applied at the input of the laser diode 102.

The curve 301 exhibits an overshoot after the transition from "0"-level to "1"-level and an undershoot after the transition from "0"-level to "1"-level. This overshoot/undershoot is due to the self-resonance (relaxation oscillation) of the laser diode 102, and therefore is intrinsic to the optical pulse output by the laser diode 102. Particularly, the curve 301 makes a transition from "0"-level to "1"-level, overshoots the "1"-level by the intrinsic overshoot, settles to the "1"-level, makes a transition from the "1"-level to the "0"-level, undershoots the "0"-level by the intrinsic undershoot, and then settles to the "0"-level.

Curve 302 of FIG. 3 also exhibits an overshoot after the transition from "0"-level to "1"-level and an undershoot after the transition from "1"-level to "0"-level. The overshoot of curve 302 exceeds the intrinsic overshoot of the laser diode 102 by the overshoot that is induced by the pre-emphasized electrical pulse applied at the input of the laser diode 102. The undershoot of curve 302 exceeds the intrinsic undershoot of the laser diode 102 by the undershoot that is induced by the pre-emphasized electrical pulse applied at the input of the laser diode 102. Particularly, the curve 302 makes a transition from "0"-level to "1"-level, overshoots the "1"-level by a resultant overshoot that is induced by both the intrinsic overshoot of the laser diode 102 and the overshoot of the pre-emphasized electrical input pulse, then relaxes to the "1"-level, makes a transition from "1"-level to "0"-level, undershoots the "0"-level by a resultant undershoot that is induced by both the intrinsic undershoot of the laser diode 102 and the undershoot of the pre-emphasized electrical input pulse, and then relaxes to "0"-level.

The effect of the pre-emphasis driver 101 on the optical signal output by the laser diode 102 becomes evident when comparing the curves 302 and 301 of FIG. 3 to each other. This comparison shows that the transition times from one optical power level to another optical power level are shorter for curve 302. In other words, pre-emphasizing/peaking the input pulse of the laser diode 102 during and/or immediately after the transition from one binary level to the other binary level steepens the edges of the optical signal output by the laser diode.

However, the large overshoot of the optical pulse enhances the possibility of oscillations during the relaxation to the "1"-level. Also, the large undershoot of the optical pulse enhances the possibility of oscillation during the relaxation to the "0"-level. These relaxation oscillations prolong the time required for the stabilization of the optical signal around an optical power level. If, however, the pulse duration is too short to ensure stabilization (setting) of the optical signal, intersymbol interference may occur. This is detrimental to signal integrity of the optical signal.

SUMMARY

It is therefore an object of the invention to provide a method for improving signal quality/integrity of a digital signal being transmitted through a non-linear device or a bandwidth-limited channel.

A digital signal processing method has steps of pre-emphasizing a digital signal, and then processing the pre-emphasized digital signal through a non-linear device. In the pre-emphasizing step, an undershoot is applied to a first level of the digital signal at a positive signal transition or an overshoot is applied to the digital signal at a negative first signal transition.

BRIEF DESCRIPTION OF DRAWINGS

The invention will now be described by way of example with reference to the accompanying drawings, of which.

BRIEF DESCRIPTION OF THE EMBODIMENT(S)

The present invention is based on the idea that pre-emphasizing a pulse of a digital (binary) signal before the transition/edge of the pulse effectively shortens the rise time and fall time of the pulse. The present invention also recognizes that the optical pulse output by a laser diode, in response to an electric pulse having pre-emphasis before its transitions, has shorter transition times than the optical pulse output by a laser diode in response to an electric pulse having pre-emphasis after its transitions. Also, the optical pulse output in response to a pulse having pre-emphasis before its transitions has a better signal quality than the optical pulse output in response to a pulse having pre-emphasis after or during its transitions.

Figure 4:
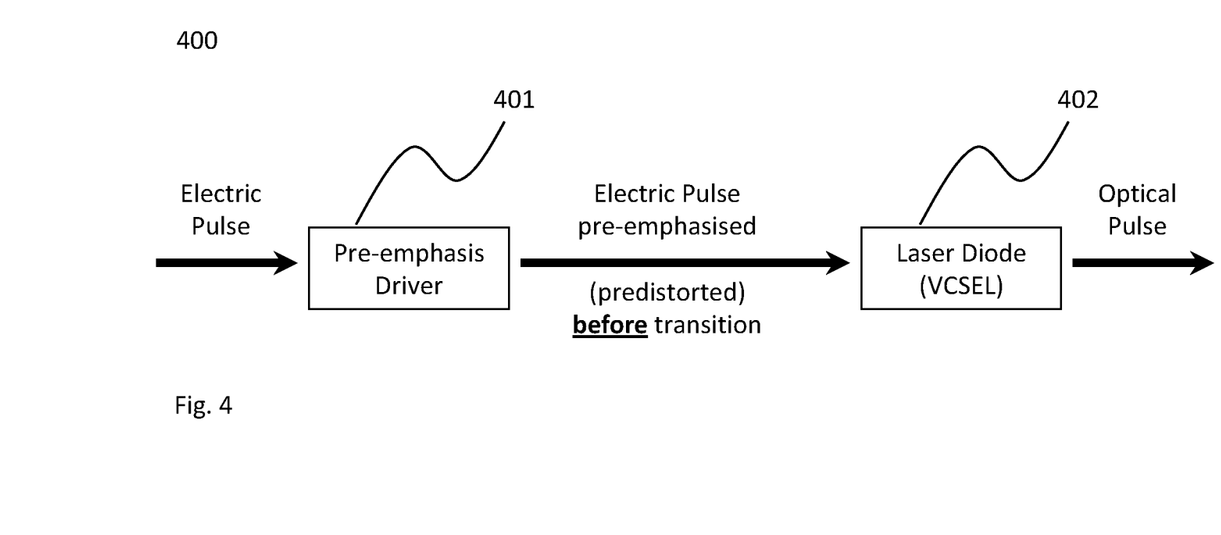
FIG. 4 shows a schematic of a transmitter in accordance with an exemplary embodiment of the present invention.

FIG. 4 shows an exemplary embodiment of a transmitter 400 having a pre-emphasis driver 401 and a non-linear device 402 connected to the pre-emphasis driver 401. The pre-emphasis driver 401 receives at an electrical digital signal input including at least one binary pulse, pre-emphasizes/peaks the received electrical digital signal, and outputs a pre-emphasized electrical digital signal. The non-linear device 402 receives at its input the pre-emphasized electrical digital signal outputted by the pre-emphasis driver 401, processes the received signal, and outputs a digital signal into a transmission medium (not shown). In exemplary embodiments, the non-linear device 402 may be a laser diode as shown, a light-emitting diode, or a transistor and an amplifier. Depending on the non-linear device 402 used, the digital signal output by the non-linear device 402 can be an electric signal or an optical signal. The transmitter 400 may therefore be an opto-electronic transmitter or an electronic transmitter.

Referring now to FIGS. 5a to 5d, the effect of the pre-emphasis driver 401 on the received electrical digital signal will be explained.

Figure 5A:
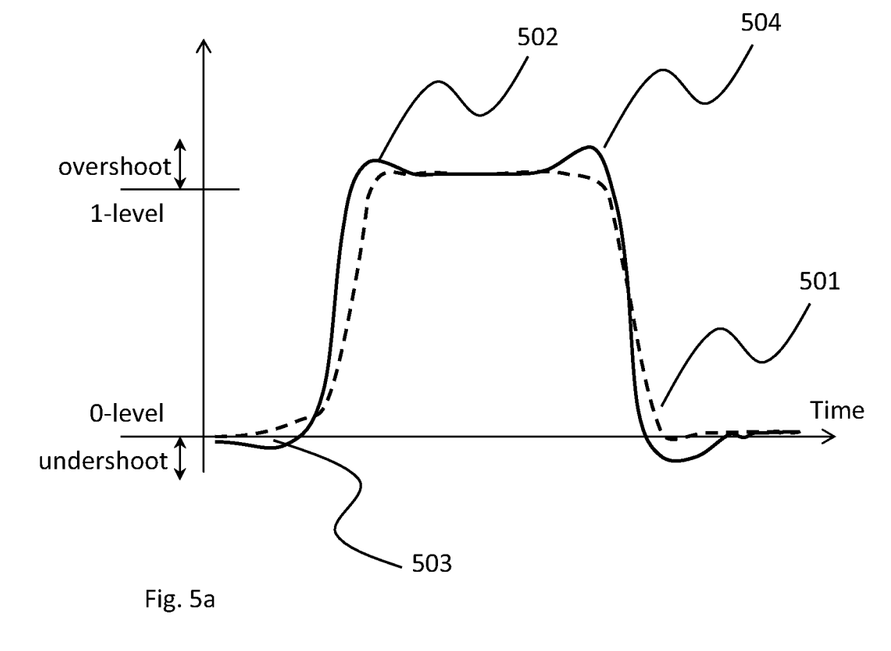
FIG. 5a shows the shape of a positive binary pulse input to the pre-emphasis driver of the transmitter and the shape of the pulse output by the same in response to the positive binary input pulse.

In FIG. 5a, the curve 501 represents the shape of a pulse of a digital (binary) signal input to the pre-emphasis driver 401. This pulse makes a first, positive transition from a low level ("0"-level) to an high level ("1"-level), remains approximately constant at the high level for the duration of the pulse, and thereafter makes a second, negative transition from the high level to the low level. The curve 502 represents the shape of the signal output by the pre-emphasis circuit 401 in response to the pulse 501. This curve exhibits an undershoot immediately before or proximate the positive transition from the low level to the high level and an overshoot immediately before or proximate the negative transition from the high level to the low level. It should be understood that when reference is made herein to overshoot or undershoot before or proximate a transition, such reference is intended to be synonymous with a recitation of at the transition. Specifically, the curve 502 undershoots the low level by the undershoot 503, makes a first transition from the low level to the high level, stays approximately constant at the high level, overshoots the high level by the overshoot 504, makes a second transition from the high level to the low level, and then stays approximately constant to the low level.

Figure 5B:
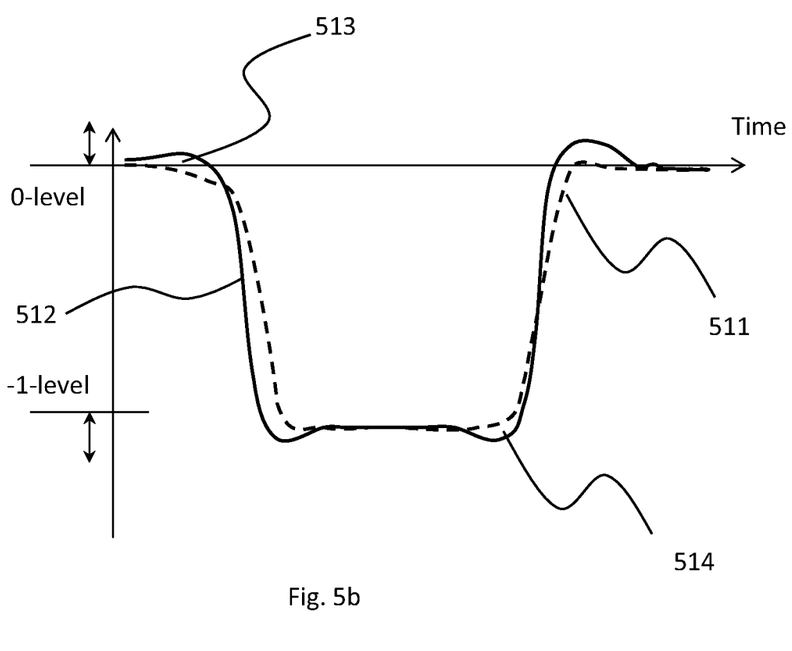
FIG. 5b shows the shape of a negative binary pulse input to the pre-emphasis driver of the transmitter and the shape of the pulse output by the same in response to the negative binary input pulse.

The pulse 501 shown in FIG. 5a is an exemplary embodiment, but one of ordinary skill in the art would understand that the invention is also applicable to an inverted pulse 511 shown in FIG. 5b. The inverted pulse 511 in FIG. 5b starts at an high level ("0"-level), makes a first, negative transition from the high level to a low level ("−1"-level), remains approximately constant at the low level during the pulse length, and thereafter makes a second, positive transition from the low level to the high level. Curve 512 in FIG. 5b represents the shape of the signal output by an pre-emphasis circuit in response to the pulse 511. This curve exhibits an overshoot immediately before or proximate the negative transition from the high level to the low level and an undershoot immediately before or proximate the positive transition from the low level to the high level. Particularly, the curve 512 overshoots the high level ("0"-level) by the overshoot 513, makes a first transition from the high level to the low level ("−1"-level), stays approximately constant at the low level, undershoots the low level ("−1"-level) by the undershoot 514, makes a second transition from the low level to the high level, and then stays approximately constant at the high level.

One of ordinary skill in the art would understand that the above described pulse may be part of a sequence of pulses, but also may be a single pulse signal, known as a monopulse.

The pre-emphasis driver 401 of the transmitter 400 will emphasize/peak a (binary) signal level of an electric digital signal immediately before or proximate the transition from one binary signal level to the other binary signal level.

TABLE 1

| Parameter | Without pre-emphasis | Pre-emphasis after the transition | Pre-emphasis before the transition |
| --- | --- | --- | --- |
| Overshoot [%] | 6.0 | 16.9 | 6.4 |
| Rise Time [ps] | 14.7 | 13.4 | 12.8 |
| Fall Time [ps] | 15.7 | 14.3 | 13.3 |
| Eye Opening Factor | 0.84 | 0.64 | 0.59 |

The effect of the pre-emphasis driver 401 is shown in Table 1, which shows: parameters of the pulse 203 output by a non-linear device in response to a square pulse 201 without pre-emphasis, parameters of the pulse 202 output by the conventional pre-emphasize driver 101 with pre-emphasis after the transition in response to the input pulse 201, and parameters of the pulse 502 output by the pre-emphasize driver 401 with pre-emphasis before the transition in response to the input pulse 501. The following parameters are indicated: the overshoot beyond the "1"-level; the rise time of the positive transition from "0"-level to "1"-level; the fall time of the negative transition from "1"-level to "0"-level; and the eye opening factor. The eye opening factor relates to the eye diagram of the digital signal including the respective pulses and is equal to the ratio between inner eye opening (eye height) and eye amplitude.

Table 1 shows that the output pulse 502 of the pre-emphasize driver 401 has the shortest rise time and the shortest fall time. This performance is achieved with an overshoot that is significantly lower than the overshoot induced by a conventional pre-emphasis driver. As the overshoot of the output pulse 502 of the pre-emphasize driver 401 is much lower than the overshoot of the output pulse 202 of the conventional pre-emphasize driver 101, unwanted enhancement of relaxation oscillations is much lower in the output pulse 502 of the pre-emphasize driver 401 than in the output pulse 202 of the conventional pre-emphasize driver 201. Furthermore, Table 1 shows that the digital signal output by the pre-emphasize driver 401 has short transition times that are not achieved at the expense of signal quality.

In a first exemplary embodiment shown in FIG. 5a, the undershoot applied to the "0"-level is immediately before or proximate the first, positive transition of the pulse 502, and the overshoot applied to the "1"-level is immediately before the second, negative transition of the pulse 502. In another exemplary embodiment, only an undershoot is applied to the "0"-level immediately before the first transition of the pulse 502, but no overshoot is applied to the "1"-level immediately before the second transition of the pulse 502. In another exemplary embodiment, only an overshoot is applied to the "1"-level immediately before the second transition of the pulse 502, but no undershoot is applied to the "0"-level immediately before the first transition of the pulse 502.

Furthermore, in an exemplary embodiment, the undershoot applied to the low level is immediately before the first transition of pulse 502 and that the overshoot applied to the high level is immediately before the second transition of pulse 502. In other exemplary embodiments, the undershoot applied to the low level before the first transition of pulse 502 is closer to the first transition of the pulse 502 than to the second transition of a pulse preceding pulse 502, and/or the overshoot applied to the high level before the second transition of pulse 502 is closer to the second transition of pulse 502 than to the first transition of pulse 502.

In a second exemplary embodiment shown in FIG. 5b, in the output signal of the pre-emphasis driver, the overshoot applied to the high level ("0"-level) is immediately before or proximate the first negative transition of the pulse 512, and the undershoot applied to the low level ("−1"-level) is immediately before the second positive transition of the pulse 512. In another exemplary embodiment, only an overshoot is applied to the high level ("0"-level) immediately before the first transition of the pulse 512, but no undershoot is applied to the low level ("−1"-level) immediately before the second transition of the pulse 512. In another exemplary embodiment, only an undershoot is applied to the low level ("−1"-level) immediately before the second transition of the pulse 512, but no overshoot is applied to the high level ("0"-level) immediately before the first transition of the pulse 512.

In yet another embodiment, the overshoot applied to the high level before the first transition of pulse 512 is closer to the first transition of the pulse 512 than to the second transition of a pulse preceding pulse 512, and/or the undershoot applied to the low level before the second transition of pulse 512 is closer to the second transition of pulse 512 than to the first transition of pulse 512.

In FIGS. 5a and 5b, only pulses making a transition from a first level to a second level and vice versa are shown. However, in addition to binary (two-level) digital signals, other exemplary embodiments include digital signals with more than two-levels, known as multi-level signals.

Figure 5C:
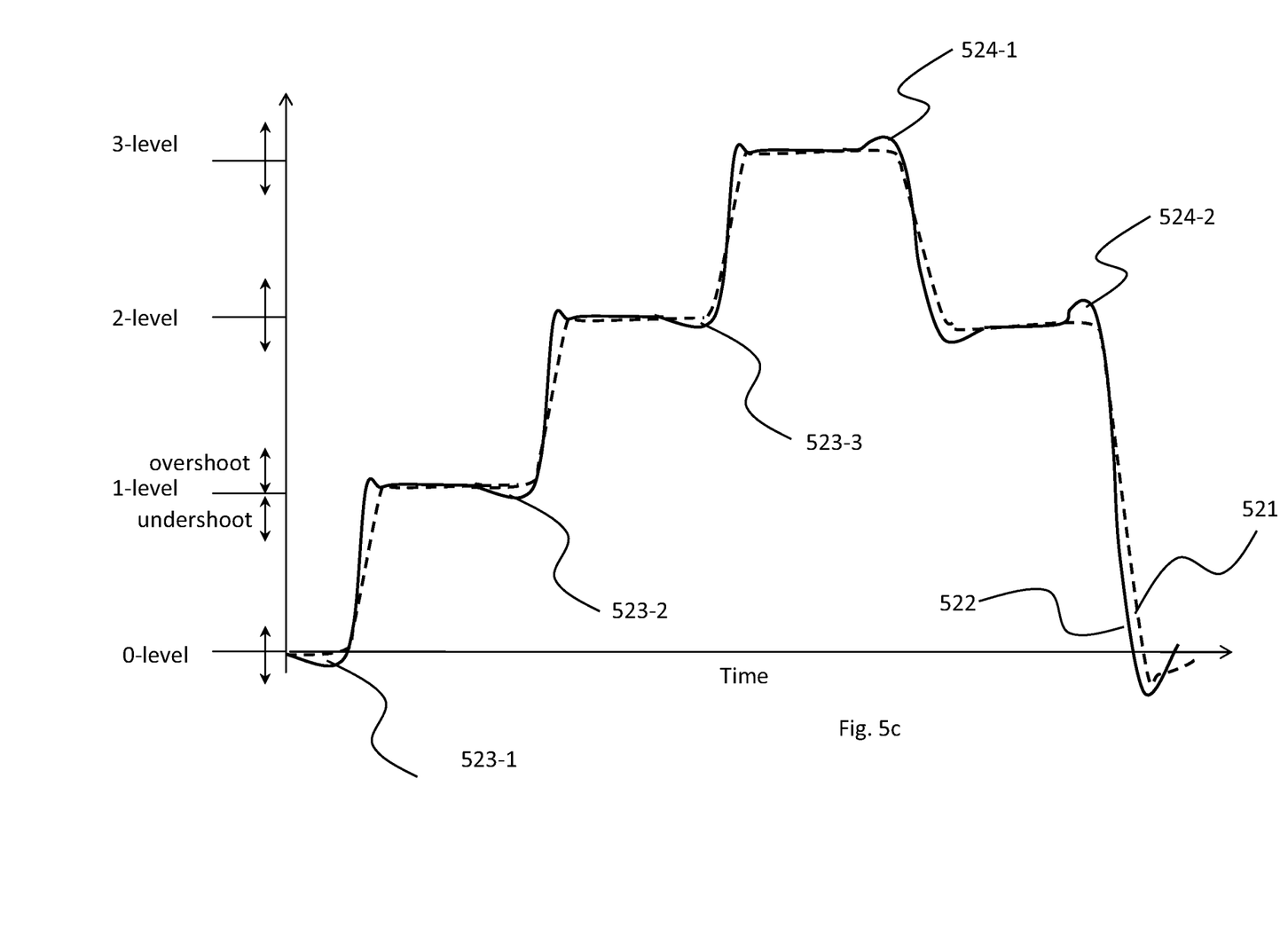
FIG. 5c shows the shape of positive four-level pulses input to the pre-emphasis driver of the transmitter and the shape of the pulses output by the same in response to the positive four-level input pulses.

FIG. 5c shows an exemplary embodiment where a curve 521 represents four pulses of a four-level digital signal input to the pre-emphasis driver 401. This four-level digital signal makes a first positive transition from a first level ("0"-level) to a second level ("1"-level), which is higher than the first level, remains approximately constant at the second level for the duration of the pulse, thereafter makes a second positive transition from the second level to a third level ("2"-level), which is higher than the second level, remains approximately constant at the third level for the duration of the pulse, thereafter makes a third positive transition from the third level to a fourth level ("3"-level), which is higher than the third level, remains approximately constant at the fourth level for the duration of the pulse, thereafter makes a fourth negative transition from the fourth level to the third level, remains approximately constant at the third level for the duration of the pulse, and thereafter makes a fifth negative transition from the third level to the first level.

The curve 522 represents the shape of the signal output by the pre-emphasis circuit in the transmitter according to the third embodiment in response to the fourth-level digital signal 521. This curve exhibits an undershoot immediately before or proximate the positive transitions, which are the transitions from a low level to a higher level, and an overshoot immediately before or proximate the negative transitions, which are the transitions from a higher level to a low level. For example, the curve 522 undershoots the first level ("0"-level) by an undershoot 523-1, makes a first transition from the first level to the second level ("1"-level), stays approximately constant at the second level, thereafter undershoots the second level by an undershoot 523-2, makes a second transition from the second level to the third level ("2"-level), stays approximately constant at the third level, thereafter undershoots the third level by an undershoot 523-3, makes a third transition from the third level to the fourth level ("3"-level), stays approximately constant at the fourth level, overshoots the fourth level by the overshoot 524-1, makes a fourth transition from the fourth level to the third level, stays approximately constant to the third level, and thereafter overshoots the third level by the overshoot 524-2, and makes a fifth transition from the third level to the first level.

In the exemplary embodiment shown in FIG. 5c, the four levels of the four-level digital signal have a positive polarity. However, in the exemplary embodiment shown in FIG. 5d, the four levels of the four-level digital signals have a negative polarity. In a fourth exemplary embodiment shown in FIG. 5d, a curve 531 shows the shape of four pulses of a four-level digital signal input to the pre-emphasis driver included in a transmitter. This signal makes transitions between a first level ("0"-level), a second level ("-1"-level), which is lower than the first level, a third level ("-2"-level), which is lower than the second level, and a fourth level ("-3"-level), which is lower than the third level. The first, second, third and fourth levels have a negative polarity. The curve 532 represents the shape of the signal output by the pre-emphasis circuit included in the transmitter according to the fourth embodiment in response to the fourth-level digital signal 531. The curve 532 exhibits an undershoot 534-1 and 534-2 immediately before or proximate the positive transitions, which are the transitions from a low level to a higher level, and an overshoot 533-1, 533-2 and 533-3 immediately before or proximate the negative transitions, which are the transitions from a higher level to a low level.

Figure 5D:
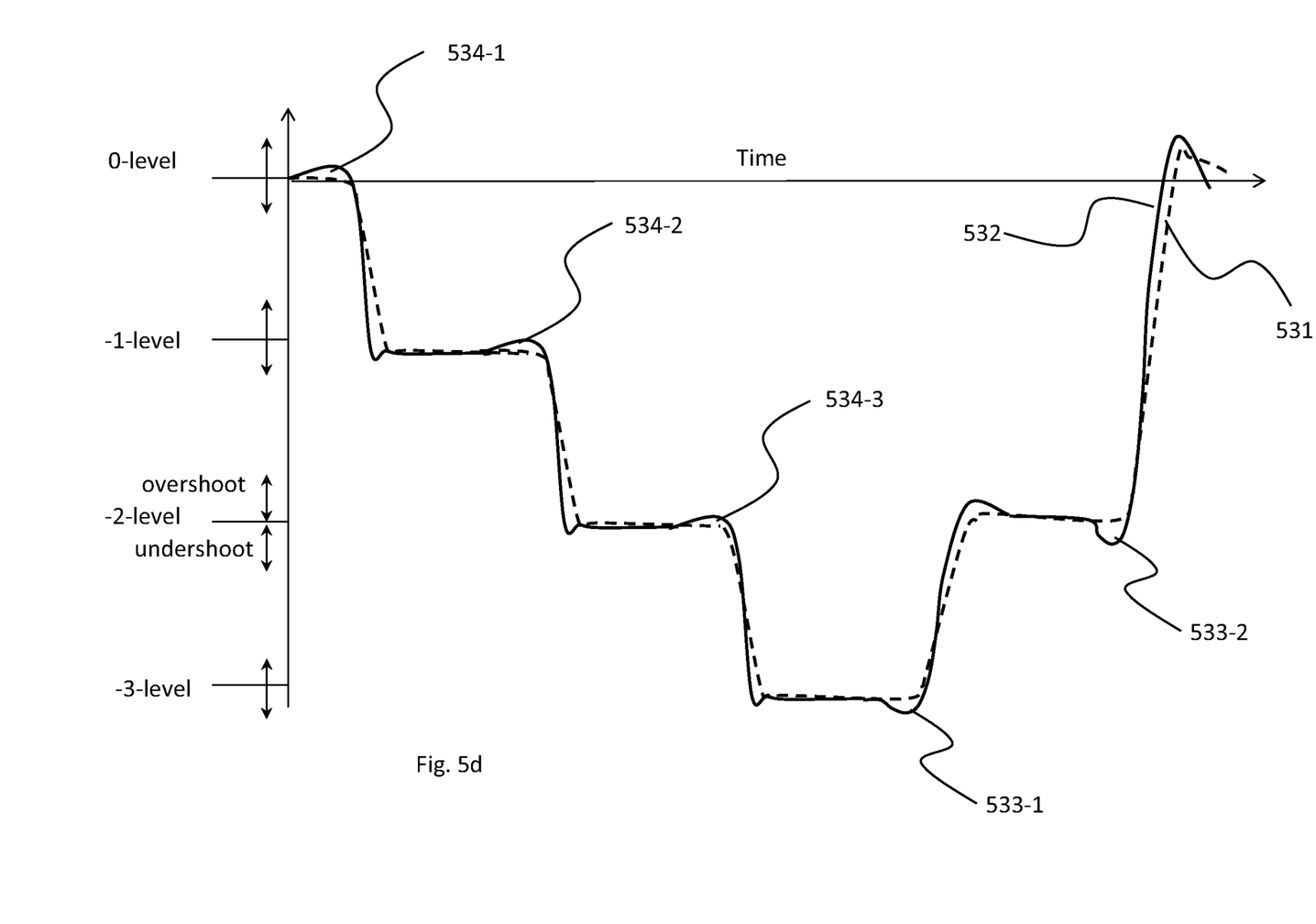
FIG. 5d shows the shape of negative four-level pulses input to the pre-emphasis driver of the transmitter and the shape of the pulses output by the same in response to the negative four-level input pulse.

In the embodiments shown in FIGS. 5c and 5d, the four levels of the four-level digital signal have the same polarity. In other exemplary embodiments, the four-level digital signals may include levels having different polarities.

The four-level digital signals shown in FIGS. 5c and 5d are only exemplary embodiments of multi-level digital signals, but are not limiting. One of ordinary skill in the art would understand that the present invention is applicable to any multi-level digital signal having an arbitrary number of levels, making transitions between any two levels of the digital signal, and making an arbitrary number of positive and/or negative transitions between two levels of the digital signal.

Therefore, the transmitter disclosed above can process a digital signal having a plurality of levels m and which makes one or a plurality of transitions n between any two levels of the plurality of levels, wherein m and n are natural numbers, and m is greater than or equal to 2, and n is greater than or equal to 1. The transmitter includes a pre-emphasize driver which can emphasize/peak a level of the digital signal immediately before the transition from a first level to a second level of the plurality of levels. For example, in an exemplary embodiment the pre-emphasize driver can pre-emphasize the digital signal by applying an undershoot to the first level immediately before the transition, when the first level is lower than the second level at a positive transition, and to pre-emphasize the digital signal by applying an overshoot to the first level immediately before the first transition, when the first level is higher than the second level at a negative transition.

In another exemplary embodiment, the non-linear device 402 is a laser diode such as VCSEL. The non-linear device 402 converts electrical input pulses into optical output pulses. When the rise time and fall time of the input pulse are too large, the laser diode can spread out the optical output pulse over the subsequent symbol period, causing intersymbol distortion. The conventional method of pre-emphasizing the electrical input pulse shortens the rise time and fall time of the input pulse. However, the conventional method causes a high overshoot and undershoot in the optical output pulse (see FIG. 3), which also can cause intersymbol interference. In view of this drawback, a method for pre-emphasizing the electrical input pulse that shortens the rise time and fall time of the optical output pulse, but does not significantly increase the overshoot and undershoot of the optical output pulse is desirable.

Figure 6:
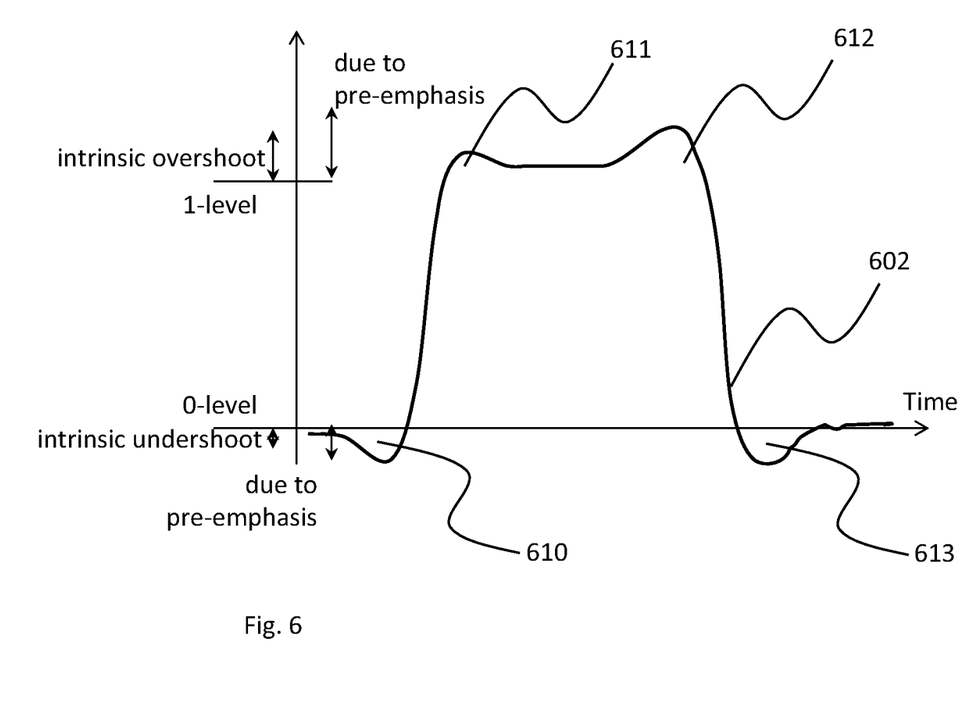
FIG. 6 shows the shape of an optical pulse output by a laser diode in response to a pulse output by the pre-emphasis driver of the transmitter.

FIG. 6 and Table 2 show exemplary embodiments that address this drawback.

In FIG. 6, a curve 602 represents the optical power emitted by the laser diode in response to the electrical pulse 502 shown in FIG. 5. The curve 602 exhibits a first undershoot 610 before the transition from "0"-level to "1"-level, a first overshoot 611 after the transition from "0"-level to "1"-level, a second overshoot 612 before the transition from "1"-level to "0"-level, and a second undershoot 613 after the transition from "1"-level to "0"-level. The first undershoot 610 is due to the undershoot 503 of the input pulse 502. The first overshoot 611 is mainly due to the intrinsic overshoot (relaxation oscillations) of the laser diode. The second overshoot 612 is due to the overshoot 504 of the input pulse 502. The second undershoot 613 is mainly due to the intrinsic undershoot (relaxation oscillations) of the laser diode. For example, the curve 602 undershoots the "0"-level by the first undershoot 610, makes a transition from "0"-level to "1"-level, overshoots the "1"-level by the first overshoot 611, relaxes to the "1"-level, overshoots the "1"-level again by the second overshoot 612, makes a transition from "1"-level to "0"-level, undershoots the "0"-level by the second undershoot 613, and then relaxes to "0"-level.

TABLE 2

| Parameter | Without pre-emphasizing | Pre-emphasis after the transition | Pre-emphasis before the transition |
| --- | --- | --- | --- |
| Overshoot [%] | 11.4 | 19.0 | 15.5 |
| Rise Time [ps] | 23.6 | 21.1 | 19.4 |
| Fall Time [ps] | 30.0 | 27.3 | 26.5 |
| Eye Opening Factor | 0.26 | 0.30 | 0.45 |
| Number of mask hits | 27 | 45 | 4 |

Table 2 discloses parameters of the optical pulse output by the laser diode in response to the pulse 203 shown in FIG. 2 without pre-emphasis, parameters of the optical pulse output by the laser diode in response to the pulse 202 of FIG. 2 with pre-emphasis during/after the transition, and parameters of the optical pulse output by the laser diode in response to the pulse 502 of FIG. 5 with pre-emphasis before the transition. The following parameters are included in Table 2: the overshoot of the optical signal beyond the "1"-level; the rise time of the transition from "0"-level to "1"-level; the fall time of the transition from "1"-level to "0"-level; the eye opening factor; and the number of mask hits.

Table 2 shows that the optical pulse output of FIG. 6 has the shortest rise time and the shortest fall time. These transition times are achieved at an overshoot beyond the "1"-level which is much lower than the overshoot beyond the "1"-level of the optical pulse output by the laser diode in response to pulse 202 of FIG. 2 (showing pre-emphasis after the transition). Having a smaller overshoot beyond the "1"-level, the optical pulse output by the fifth exemplary embodiment is less susceptible to relaxation oscillations than the optical pulse output by the conventional transmitter shown in FIG. 1.

Furthermore, Table 2 shows that the optical pulse output by the laser diode of the fifth exemplary embodiment achieves the highest eye opening factor and the lowest number of mask hits. Thus, the fifth exemplary embodiment further shortens the rise time and the fall time of the optical output pulse 602, as well as improving the signal quality.

As the present invention improves signal quality, particularly contributes to the reduction of intersymbol interference, it is especially suited in communication systems having high data transmission rates, such as 25 Gbps.

What is claimed is:

1. A digital signal processing method, comprising the steps of:
   pre-emphasizing a digital signal by applying an undershoot to a first level of the digital signal before a positive first signal transition, or by applying an overshoot to the digital signal before a negative first signal transition; and
   processing the pre-emphasized digital signal through a non-linear device.

2. The method according to claim 1, wherein the pre-emphasizing of the digital signal further comprises applying an overshoot to a second level before a negative second transition, or by applying an undershoot to the second level before a positive second transition when the second level is lower than a third level.

3. The method according to claim 2, wherein the first level is different from the third level.

4. The method according to claim 2, wherein the first level and the third level coincide.

5. The method according to claim 2, wherein pre-emphasizing the digital signal further comprises a third transition from a fourth level to the first level, such that:
   when the first level is lower than the second level, an undershoot is applied to the first level before the first transition,
   when the first level is lower than the second level, an overshoot applied to the second level before the second transition,
   when the first level is higher than the second level, an overshoot applied to the first level before the first transition, and
   when the first level is higher than the second level, the undershoot applied to the second level before the second transition.

6. The method according to claim 2, wherein the undershoot applied to the first level is immediately before the first transition, or the undershoot applied to the second level is immediately before the second transition, or the overshoot applied to the second level is immediately before the second transition, or the overshoot applied to the first level is immediately before the first transition.

7. The method according to claim 2, wherein the first level, the second level and the third level have the same polarity.

8. The method according to claim 2, wherein at least one level of the first level, the second level and the third level has a first polarity and another level of the first level, the second level and the third level has a second polarity different from the first polarity.

9. The method according to claim 1, wherein the non-linear device is a laser diode, a light-emitting diode, a photodiode, a transistor or an amplifier.

10. An apparatus for processing a digital signal through a non-linear device, comprising:
    a pre-emphasis driver with an output of a pre-emphasized digital signal having an undershoot at a first level before a positive first transition wherein the first level is lower than a second level; or an output of a pre-emphasized digital signal with an overshoot at the first level before a negative first transition wherein the first level is higher than the second level; and
    a digital signal processing non-linear device having a pre-emphasized digital signal input.

11. The apparatus according to claim 10, wherein the pre-emphasis driver further comprises an output of a pre-emphasized digital signal having a second transition following the first transition from the second level to a third level, with
    an overshoot to the second level before the second transition when the second level is higher than the third level, or
    an undershoot to the second level before the second transition when the second level is lower than the third level.

12. The apparatus according to claim 11, wherein the first level is different from the third level.

13. The apparatus according to claim 11, wherein the first level and the third level coincide.

14. The apparatus of claim 11, wherein the pre-emphasis driver further comprises an output of a pre-emphasized digital signal having a third transition from a fourth level to the first level, with
    an undershoot at the first level before the first transition when the first level is lower than the second level,
    an overshoot at the second level before the second transition when the first level is lower than the second level,
    an overshoot at the first level before the first transition when the first level is higher than the second level, and
    an undershoot at the second level before the second transition when the first level is higher than the second level.

15. The apparatus of claim 11, wherein the undershoot applied to the first level is immediately before the first transition, or
    the undershoot applied to the second level is immediately before the second transition, or
    the overshoot applied to the second level is immediately before the second transition, or
    the overshoot applied to the first level is immediately before the first transition.

16. The apparatus of claim 11, wherein all of the first level, the second level and the third level have the same polarity.

17. The apparatus of claim 11, wherein at least one level of the first level, the second level and the third level has a first polarity and at least another level of the first level, the second level and the third level has a second polarity different from the first polarity.

18. The apparatus of claim 11, wherein the non-linear device is a laser diode, a light-emitting diode, a photodiode, a transistor or an amplifier.

19. The apparatus of claim 10, further comprising a transmitter having a digital signal transmitting output connected to a transmission medium.

20. The apparatus according to claim 19, wherein the non-linear device is a laser diode and the transmission medium is an optical fiber.

21. A communication system comprising:
- an apparatus for processing a digital signal through a non-linear device, having:
  - a pre-emphasis driver with an output of a pre-emphasized digital signal having an undershoot at a first level before a first positive signal transition; or an output of a pre-emphasized digital signal with an overshoot at the first level before a first negative signal transition; and
  - a digital signal processing non-linear device having a pre-emphasized digital signal input; and
- a transmitter having a digital signal transmitting output connected to a transmission medium.

* * * * *